United States Patent [19]
Suzuki et al.

[11] Patent Number: 5,329,141
[45] Date of Patent: Jul. 12, 1994

[54] LIGHT EMITTING DIODE

[75] Inventors: Akira Suzuki; Yoshihisa Fujii, both of Nara; Hajime Saito, Tenri; Katsuki Furukawa, Sakai; Yoshimitsu Tajima, Nara, all of Japan

[73] Assignee: Sharp Kabushiki Kaisha, Osaka, Japan

[21] Appl. No.: 968,973

[22] Filed: Oct. 30, 1992

[30] Foreign Application Priority Data

Oct. 31, 1991 [JP] Japan .................... 3-286741

[51] Int. Cl.$^5$ ............................. H01L 33/00
[52] U.S. Cl. ............................ 257/103; 257/77; 257/102; 257/613; 257/656; 257/657
[58] Field of Search ................ 257/102, 103, 77, 613, 257/656, 657

[56] References Cited

U.S. PATENT DOCUMENTS 4,918,497 4/1990 Edmond.
5,027,168 6/1991 Edmond .......................... 257/103

OTHER PUBLICATIONS

U.S. Patent Application Serial No. 07/702,819 (filed on May 17, 1991). A copy is not included herewith.
Ikeda et al., "Fabrication of 6H-SiC light-emitting diodes by a rotation dipping technique: Electroluminescence mechanisms" *J. Appl. Phys.* (1979) 50(12):8215-8225-Apr. 1979.
Matsushita et al., "SiC pn junction blue light-emitting diode" *Japan Society of Applied Physics* (1991) 60(2):159-162. A partial English translation is also enclosed. Feb. 1991.
Suzuki et al., "Effects of the junction interface properties on blue emissions of SiC blue LEDs grown by step-controlled CVD" *Journal of Crystal Growth* (1991) 115:623-627. The corresponding abstract, namely *Abstracts ICVGE-7* (The 7th International Conference on Vapour Growth and Epitaxy) (Jul. 14-17, 1991) Nagoya, Japan, p. 111, is also enclosed herewith.
Matsunami et al., "Bulk crystal growth of SiC on 3C-SiC substrates and application to step-controlled epitaxy" *Electronics Information Communcations Society, Electronic Components and Materials Study Group, Study Report, CPM90-64* (Oct. 26, 1990) 90(277)29-34. A partial English translation is also included.

*Primary Examiner*—Edward Wojciechowicz
*Attorney, Agent, or Firm*—Morrison & Foerster

[57] ABSTRACT

A light emitting diode of silicon carbide having a p-n junction comprising an n-type layer doped with donor impurities, a first p-type layer doped with acceptor impurities, and a second p-type layer doped with acceptor impurities and donor impurities. The first p-type layer has a thickness less than the diffusion length of electrons having flowed from the n-type layer. In this way, the first p-type layer effects light emission related to the acceptor impurities which recombine with the electrons having flowed from the n-type layer, and the second p-type layer effects light emission by donor-acceptor pairs which recombine with the electrons having flowed from the n-type layer.

14 Claims, 7 Drawing Sheets

LIGHT EMITTING DIODE

BACKGROUND OF THE INVENTION

1. Field of the Invention

The present invention relates to silicon carbide light emitting diodes having a p-n junction, and more particularly, to light emitting diodes which can emit blue light with high luminance.

2. Description of the Related Art

Since a light emitting diode is a small luminescent source which consumes a small amount of power and can stably emit light with high luminance, it is used as a variety of display apparatus and a light source for reading recorded information. Light emitting diodes capable of emitting visible light of a color in the range of red to green have been put into practical use. On the other hand, light emitting diodes capable of emitting blue light are now under development and have not yet attained light emission with sufficient luminance for practical use.

In general, the colors of light emitted from light emitting diodes depend on the semiconductor materials used. Semiconductor materials for blue light emitting diodes are limited to silicon carbide (SIC) that is a IV—IV group compound semiconductor, gallium nitride (GAN) that is a III-V group compound semiconductor, and zinc selenide (ZnSe) and zinc sulfide (ZnS) that are II-VI group compound semiconductors.

For the structure of light emitting diodes using the above-mentioned semiconductor materials, a p-n junction structure is most suited, where electrons and holes can be injected in a light emitting region with high efficiency. However, it is difficult to use any of GaN, ZnSe, and ZnS among the above semiconductor materials for the fabrication of light emitting diodes having a p-n junction. This is because it is difficult to obtain p-type crystals from these semiconductor materials, or, even if these crystals are obtained, they have high resistance or are very unstable.

To avoid this problem, light emitting diodes with a metal-insulator-semiconductor (MIS) structure comprising a metal layer and a thin insulating layer in addition to any of the above semiconductor materials have been fabricated. However, light emitting diodes with the MIS structure possess the disadvantages of having non-uniform device characteristics and providing unstable light emission.

On the other hand, silicon carbide can be used as a material for the p-n junction type light emitting diodes, because both p-type crystals and n-type crystals can easily be obtained. Silicon carbide includes a variety of polytypes of which band gaps are slightly different from one another. Typically, a 6H-type silicon carbide having a band gap of approximately 3 eV at room temperature is used for blue light emitting diodes.

One of the conventional methods for fabricating p-n junction type blue light emitting diodes using silicon carbide is liquid phase epitaxy (LPE). Many reports have already been made on light emitting diodes fabricated by LPE (see, for example, M. Ikeda, et al, Journal of Applied Physics, vol. 50, No. 12, 1979, pp. 8215-8225).

A blue light emitting diode using donor-acceptor pairs composed of nitrogen donors and aluminum acceptors as a luminescent center has recently been reported (Y. Matsushita, et al., Japan Society of Applied Physics, vol. 60, No. 2, 1991, pp. 159-162). As is shown in FIG. 13, the light emitting diode comprises an n-type epitaxial layer 9 doped with nitrogen as the donor and a p-type epitaxial layer 3 doped with aluminum as the acceptor, which are successively formed on an n-SiC substrate 1 in this order. The n-type epitaxial layer 9 is also doped with a small amount of aluminum, thus to form a donor-acceptor pair. This light emitting diode emits blue light having a peak wavelength of 470 to 480 nm.

However, the conventional light emitting diodes fabricated by LPE still emit light with low luminance. When they are driven at an operation current of 20 mA, for example, the luminance is only 15 mcd or less. The principal reason for this low luminance is considered to be as follows. The growth temperature of p-type and n-type crystals is as high as 1700° C. to 1800° C., so that the crystal growth takes place in active molten silicon, thereby making it difficult to accurately control the crystal growth, and presenting a great possibility that unnecessary impurities will enter the growing crystals. Moreover, there is the disadvantage that the use of LPE does not allow for the mass production of blue light emitting diodes.

A method for fabricating p-n junction type light emitting diodes by chemical vapor deposition (CVD) has been disclosed by the inventors, in which stable emission of blue light with high luminance can be obtained. According to this method, the crystal growth is controlled with high accuracy and mass production of the light emitting diodes is possible (Japanese Patent Application No. 2-129918). The inventors have also proposed another type of light emitting diode fabricated by CVD (Japanese Patent Application No. 2-184464 and No. 2-406598, and A. Suzuki, et al., Abstracts ICVGE-7 (The International Conference on Vapour Growth and Epitaxy, Nagoya, Japan), 1991, p. 111).

The proposed light emitting diode has a structure as is shown in FIG. 14, which comprises an n-SiC single-crystal layer 2 doped with nitrogen as the donor impurity and a p-SiC single-crystal layer 3 doped with aluminum as the acceptor impurity formed successively on an n-SiC substrate 1 in this order. This light emitting diode effects light emission by free exciton recombination or by acceptor-related recombination, which changes depending on the concentration of the donor impurities. The peak wavelength of this light emitting diode is 455 nm for the light emission caused by acceptor-related recombination and 425 nm for the light emission caused by free exciton recombination.

U.S. Pat. No. 4,918,497 discloses a light emitting diode in which donor-acceptor pairs composed of nitrogen donors and aluminum acceptors are present in a p-type layer. This light emitting diode has a structure as is shown in FIG. 15, which comprises an n-type layer 2, a p-type layer 4 which emits blue light by pairs of nitrogen donors and aluminum acceptors, and a p-type layer 5 doped with only aluminum acceptors, which are successively formed on an n-SiC substrate 1 in this order. The purpose of forming the p-type layer 5 is to send a current to a wider area of the p-n junction by using the low resistance of this layer, and light is not emitted from this layer. The light emitting diodes shown in FIGS. 13, 14, and 15 are all provided with a p-sided ohmic electrode 6 and an n-sided ohmic electrode 7.

In order to realize visible light emitting diodes with high luminance, the efficiency of human eyes to light, or visibility, must be considered. The relationship between the visibility and the color of emitted light is shown in FIG. 9. The visibility is highest when the light is green having an wavelength of around 555 nm. The visibility lowers as light shifts to the blue side with shorter wavelengths and to the red side with longer wavelengths. This means that a color of light with lower visibility is perceived as being darker by human eyes even though the light output is the same. Therefore, the visibility increases when the wavelength of blue light is closer to 555 nm. However, when the wavelength of blue light is closer to 555 nm, the blue color is hued with green and loses blue monochromaticity. Generally, the optimal peak wavelength of blue light with good visibility and excellent blue monochromaticity is 460 to 470 nm.

Neither of the aforementioned silicon carbide blue light emitting diodes have attained this peak wavelength. The light emitting diodes shown in FIGS. 13 and 15, both of which use pairs of nitrogen donors and aluminum acceptors, have a peak wavelength of 470 to 480 nm. Blue light with wavelengths in this range is advantageous in visibility, but it is mixed with green, thus lowering blue monochromaticity. The light emitting diode shown in FIG. 14 which includes a p-SiC single-crystal layer doped with aluminum acceptors has a peak wavelength of 455 nm. The blue light with this wavelength is excellent in blue monochromaticity, but it is disadvantageous in visibility.

SUMMARY OF THE INVENTION

The light emitting diode of silicon carbide having a p-n junction of this invention comprises: an n-type layer of silicon carbide doped with donor impurities; a first p-type layer of silicon carbide formed on the n-type layer, said first p-type layer being doped with acceptor impurities; and a second p-type layer of silicon carbide formed on the first p-type layer, said second p-type layer being doped with acceptor impurities and donor impurities; wherein said first p-type layer has a thickness less than the diffusion length of electrons having flowed from the n-type layer under a forward bias condition, so that said first p-type layer effects light emission related to the acceptor impurities caused by recombination with the electrons having flowed from the n-type layer, and said second p-type layer effects light emission by donor-acceptor pairs caused by recombination with the electrons having flowed from the n-type layer.

According to another aspect of the present invention, a light emitting diode of silicon carbide having a p-n junction is provided, including: an n-type layer of silicon carbide doped with donor impurities; a first p-type layer of silicon carbide formed on the n-type layer, said first p-type layer being doped with acceptor impurities and donor impurities; and a second p-type layer of silicon carbide formed on the first p-type layer, said second p-type layer being doped with acceptor impurities; wherein said first p-type layer has a thickness less than the diffusion length of electrons having flowed from said n-type layer under a forward bias condition, so that said first p-type layer effects light emission by donor-acceptor pairs caused by recombination with the electrons having flowed from said n-type layer, and said second p-type layer effects light emission related to the acceptor impurities caused by recombination with the electrons having flowed from said n-type layer.

According to the present invention, the light emitting diode has a structure of p-type double layers, which emit two different types of blue light separately. The thickness and the doping amounts of acceptors and donors of each p-type layer are controlled to obtain light having a peak wavelength of 460 to 470 nm.

Thus, the invention described herein makes possible the advantages of (1) providing a p-n junction type light emitting diode with good visibility and excellent blue monochromaticity, and (2) providing a p-n junction type light emitting diode which can be produced on a large scale with good controllability and reproducibility.

These and other advantages of the present invention will become apparent to those skilled in the art upon reading and understanding the following detailed description with reference to the accompanying figures.

DESCRIPTION OF THE PREFERRED EMBODIMENTS

Figure 1:
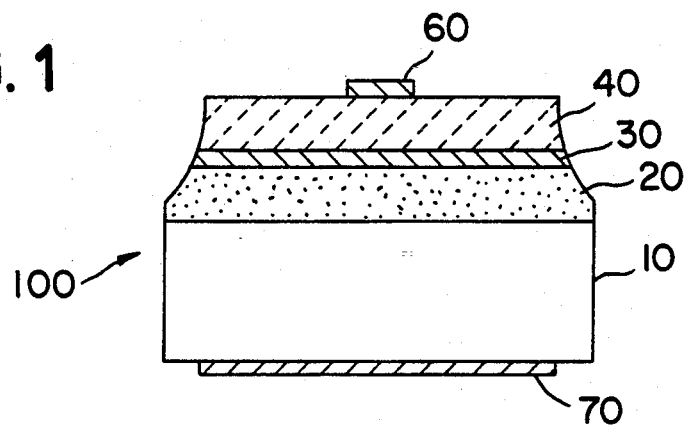
FIG. 1 is a sectional view of a light emitting diode according to the present invention.

When a forward bias voltage is applied to a light emitting diode having a p-n junction, electrons which are minority carriers flowing from an n-type layer to a p-type layer do not immediately recombine with holes in the p-type layer to emit light. Instead, they diffuse from the p-n junction into the p-type layer by a distance defined as a diffusion length and recombine with holes in the process of the diffusion. Based on this fact, the inventors have fabricated a light emitting diode in which a p-type layer has a double-layer structure composed of a layer doped with only acceptor impurities and a layer doped with both acceptor impurities and donor impurities. When the thickness of each layer is set appropriately in consideration of the diffusion length of electrons which are minority carriers, two types of light emission by the acceptors and by the donor-acceptor pairs are obtainable from these p-type layers, respectively. Thus, a p-n junction type blue monochromatic light emitting diode having the target peak wavelength in the range of 460 to 470 nm can be realized.

In general, in a p-n junction type light emitting diode, a current generated when a forward bias voltage is applied is a total of a current $I_e$ caused by electrons flowing from an n-type layer to a p-type layer and a current $I_h$ caused by holes flowing from the p-type layer to the n-type layer. The ratio of $I_e$ to $I_h$ is expressed by:

$$I_e/I_h = (\mu_e n \, 1_h)/(\mu_h p \, 1_e)$$

wherein n and p are the concentrations of electrons in the n-type layer and holes in the p-type layer under a thermal equilibrium condition, respectively, $\mu_e$ and $\mu_h$ are the mobilities of electrons in the n-type layer and holes in the p-type layer, respectively, and $1_e$ and $1_h$ are the diffusion lengths of electrons in the p-type layer and holes in the n-type layer, respectively.

In order to achieve effective flow of electrons from the n-type layer to the p-type layer, the ratio $I_e/I_h$ must be 10 or more. Therefore, the electron concentration in the n-type layer must be higher than the hole concentration in the p-type layer.

The electrons which have flowed into the p-type layer exponentially decrease in number by recombining with the holes as they diffuse in the p-type layer. When the p-n interface is 0 in the position coordinate, and the injection distance of electrons from the p-n interface is x, the number of electrons $n_p(x)$ present in the p-type layer is expressed by:

$$n_p(x) = n_p(0) \exp(-x/1_e).$$

This means that, when electrons entered the p-type layer by the diffusion length $1_e$ from the p-n interface, $n_p(1_e)/n_p(0)$ is 1/e (e is a base of a natural logarithm, i.e., 2.71828...), that is, approximately 0.37. This figure provides a "yardstick" for setting the injection distance of electrons which are minority carriers to the diffusion length $1_e$.

In the case of SiC, the values of $1_e$ and $1_h$ have been reported as 1.6 $\mu$m and 0.85 $\mu$m, respectively, and the values of $\mu_e$ and $\mu_h$ are 200 cm$^2$/Vs and 50 cm$^2$/Vs, respectively (H. Matsunami, et al, Electronics Information Communications Society, Electronic Components and Materials Study Group, Study Report, CPM90-64, 1991, pp. 29-34). When these values are put in the above expression, $I_e/I_h = 2.1 \times n/p$ is obtained. When the electron concentration in the n-type layer is made five times as high as the hole concentration in the p-type layer, $I_e/I_h$ is 10 or more. This means that the total current generated is largely occupied by the current caused by the electrons flowing from the n-type layer to the p-type layer.

In general, the diffusion length of minority carriers in a semiconductor layer is determined in a process in which the minority carriers which flow into the semiconductor layer are scattered due to thermal vibration of the semiconductor crystal lattice, lattice defects, and the presence of impurity atoms in the crystal lattice, and disappear by recombining with majority carriers. Therefore, as the semiconductor layer is doped with a larger amount of impurity atoms, the minority carriers are scattered more widely due to the increased amount of impurity atoms or by non-uniformity of the semiconductor crystal lattice. In actual blue light emitting diodes, the amount of doped impurities in the p-type layer is increased because, for example, a region doped with donors in addition to acceptors is formed in the p-type layer. Therefore, the value of $1_e$ is smaller than the above value.

In the case of the light emitting diode of the present invention, in consideration of the hole concentration of a first p-type layer to be described later, the value of $1_e$ is approximately 1 $\mu$m. The hole concentration of the first p-type layer is preferably in the range of $5 \times 10^{15}$ to $5 \times 10^{17}$ cm$^{-3}$. If the hole concentration is less than $5 \times 10^{15}$ cm$^{-3}$, light emission may not be effected. Also, if the hole concentration exceeds $5 \times 10^{17}$ cm$^{-3}$ the crystallinity of SiC may be deteriorated for effecting light emission.

In the light emitting diode of the present invention, at the application of a forward bias voltage, electrons must flow into a second p-type layer through the first p-type layer so as to recombine with holes in both p-type layers to effect different types of light emission. Therefore, in consideration of the aforementioned diffusion length $1_e$ of electrons in the p-type layer, the thickness of the first p-type layer is preferably less than 1 $\mu$m, and if desired to be more effective, it is preferably in the range of 0.01-0.5 $\mu$m. If the thickness is less than 0.01 $\mu$m, light emission in the first p-type layer may not be effected. Also, if the thickness exceeds 0.5 $\mu$m, light emission in the second p-type layer may be insufficient. In order to achieve the peak wavelength of 460 to 470 nm, the thickness of the first p-type layer is preferably in the range of 0.1-0.5 $\mu$m.

Further, when a third p-type layer having a higher hole concentration, i.e., a lower resistance than the first and second p-type layers is formed on the second p-type layer, the current flows over in the lateral directions inside the low-resistance third p-type layer, whereby light emission can be effected in a wider area of the p-n junction. Thus, the light emitting diode having the third p-type layer can emit light with improved brightness.

Nitrogen is generally used as the donor impurities. The nitrogen impurities are introduced into the n-type layer by adding nitrogen gas as impurity gas to a carrier gas and a source gas used at the growth of the n-type layer by CVD. About a half of the doped nitrogen impurities serve as electrons.

Aluminum is generally used as the acceptor impurities. The aluminum impurities are introduced into the p-type layer by adding trimethyl aluminum gas as an impurity gas to a carrier gas and a source gas used at the growth of the p-type layer by CVD, for example. About one-fiftieth of the doped aluminum impurities serve as holes.

As stated earlier, it is known that silicon carbide has a variety of polytypes. Light emission of a desired color is possible by selecting one among the polytypes. In the p-n junction type light emitting diode of the present invention, it is preferable to use 6H, 15R, and 4H types of silicon carbide which can emit light with a short wavelength corresponding to a color in the range of violet to blue.

Figure 10:
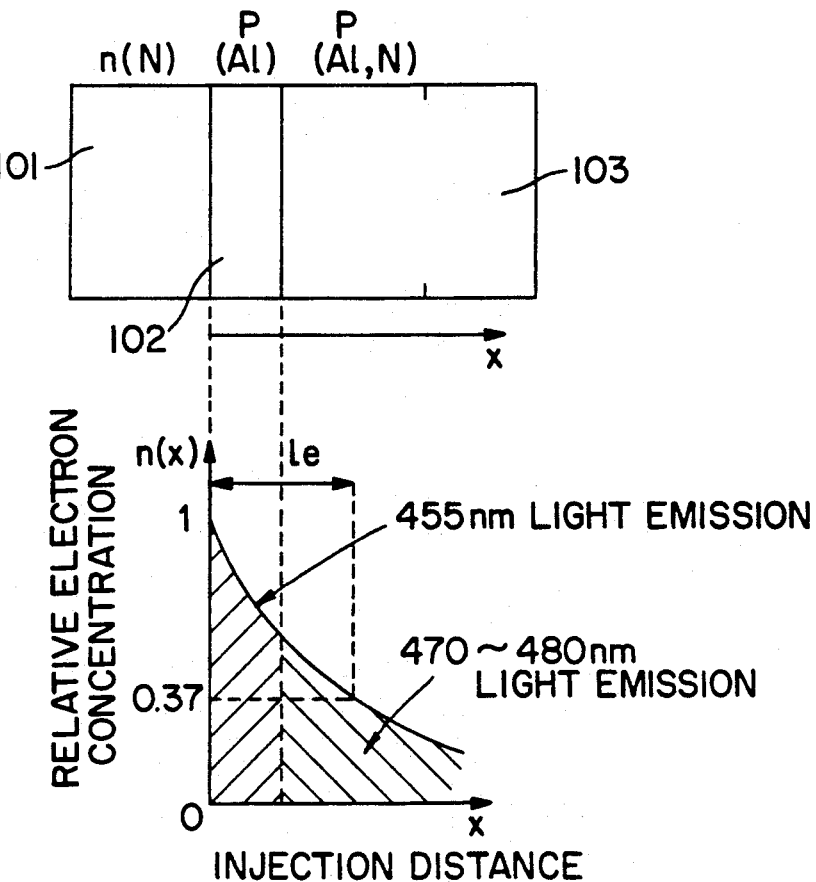
FIG. 10 shows a first structure of the light emitting diode of the present invention, together with a diagram showing a relative electron concentration in a first p-type layer and a second p-type layer of this structure.
Figure 9:
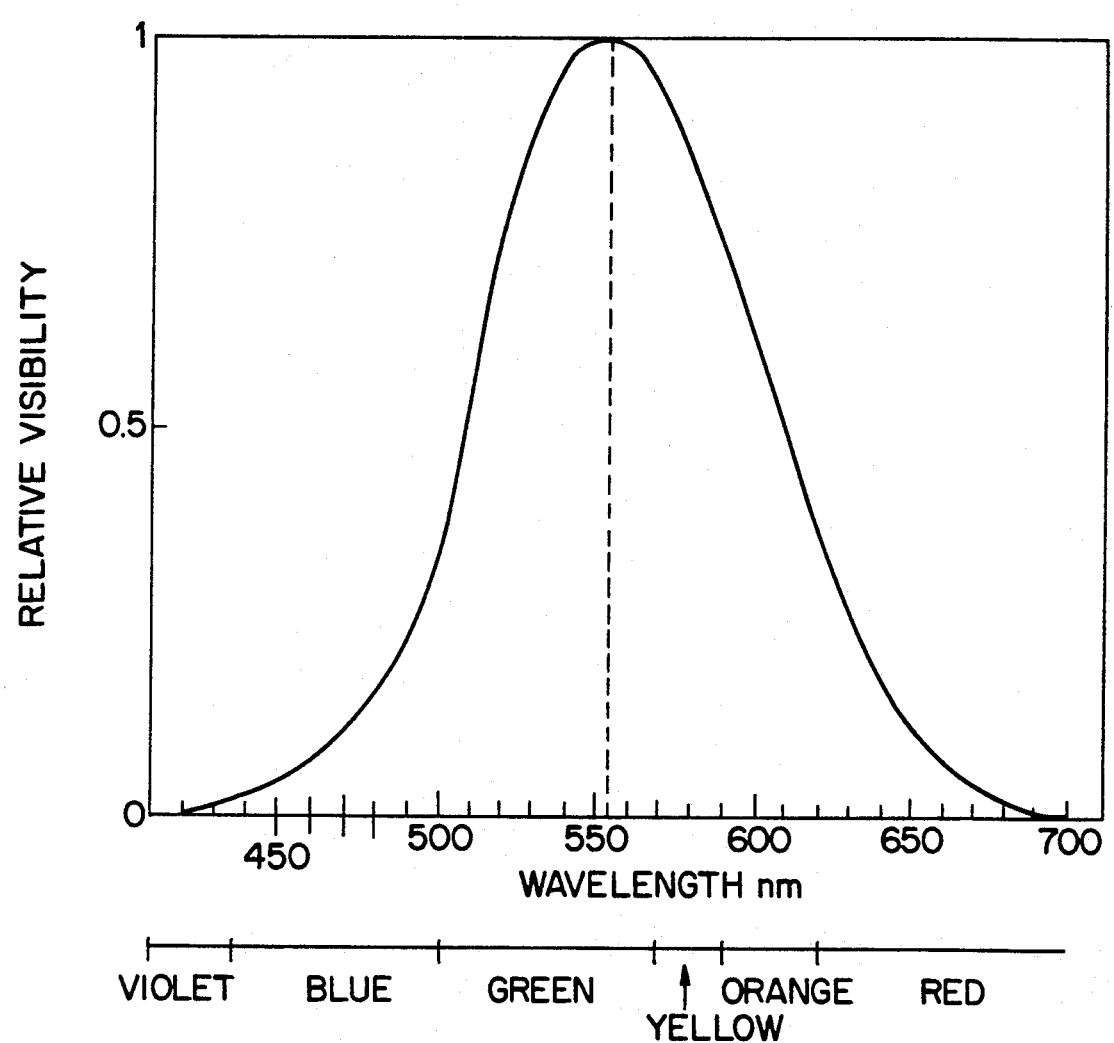
FIG. 9 shows the relationship between the visibility and the wavelength of light color.
Figure 11:
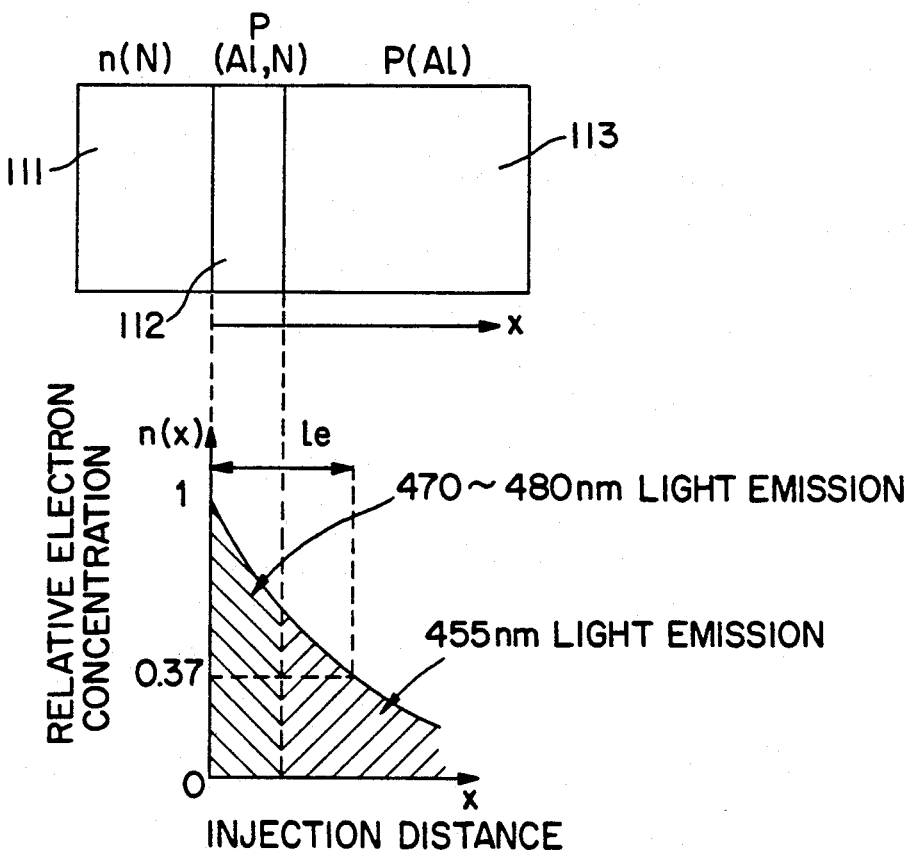
FIG. 11 shows a second structure of the light emitting diode of the present invention, together with a diagram showing a relative electron concentration in a first p-type layer and a second p-type layer of this structure.

FIGS. 10 and 11 respectively show a first and a second structure of the p-n junction type light emitting diode according to the present invention. In the first structure shown in FIG. 10, a first p-type layer 102 doped with only aluminum acceptors is formed in contact with an n-type layer 101, and a second p-type layer 103 doped with aluminum acceptors and nitrogen donors is formed on the first p-type layer 102. On the other hand, in the second structure shown in FIG. 11, a first p-type layer 112 doped with aluminum acceptors and nitrogen donors is formed in contact with an n-type layer 111, and a second p-type layer 113 doped with only aluminum acceptors is formed on the first p-type layer 112.

Figure 12:
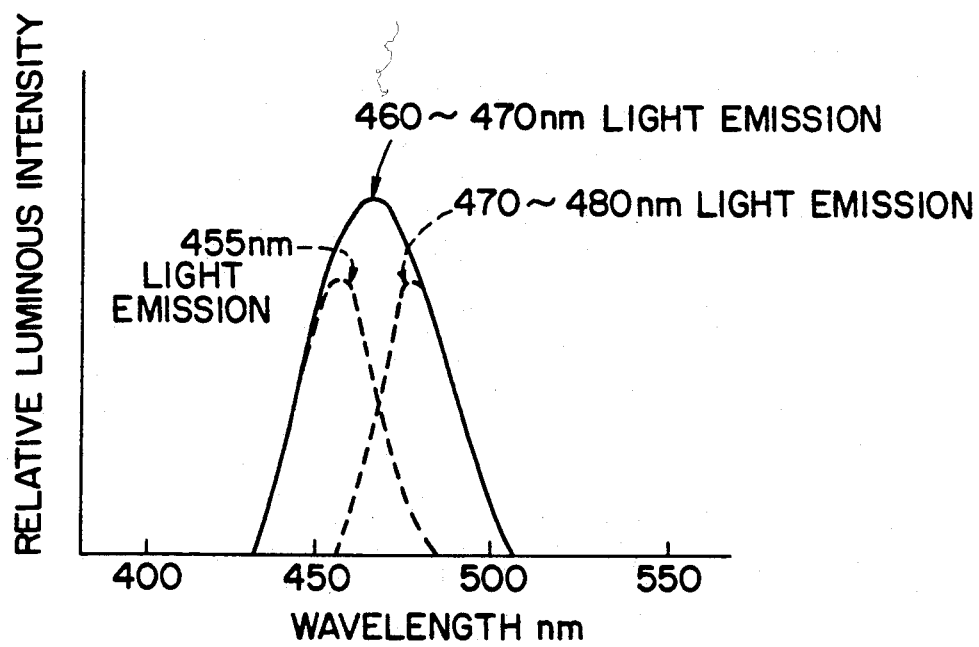
FIG. 12 is an exemplary diagram showing the relative luminous intensity of the light emitting diode according to the present invention.
Figure 13:
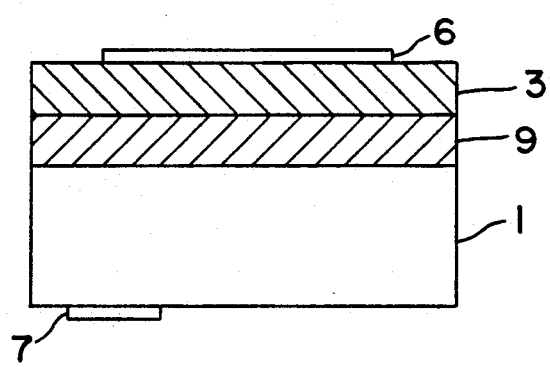
FIG. 13 is a sectional view of an existing light emitting diode.
Figure 14:
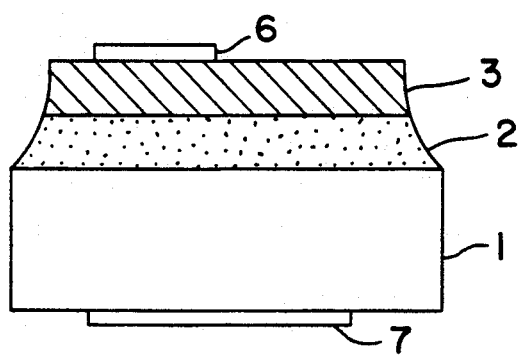
FIG. 14 is a sectional view of another existing light emitting diode.
Figure 15:
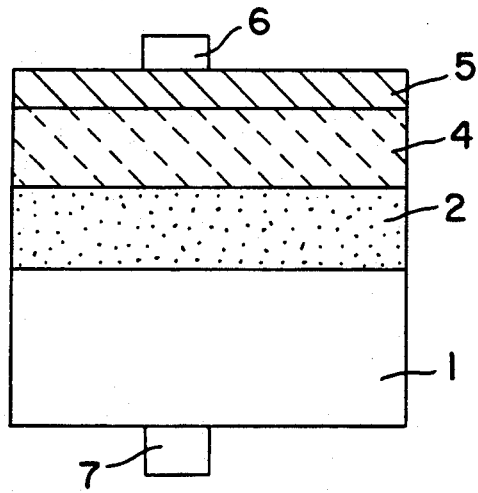
FIG. 15 is a sectional view of yet another existing light emitting diode.

FIGS. 10 and 11 also show the distribution of electrons which have flowed into the p-type layers when a forward bias voltage is applied, as well as the approximate luminous distribution. In FIG. 10, the area of the portion patterned by slanted lines extending upward to the right corresponds approximately to the intensity of the light emitted from the first p-type layer 102 (wavelength: 455 nm), and the area of the portion patterned by slanted lines extending downward to the right corresponds approximately to the intensity of the light emitted from the second p-type layer 103 (wavelength: 470–480 nm). Likewise, in FIG. 11, the area of the portion patterned by slanted lines extending downward to the right corresponds approximately to the intensity of the light emitted from the first p-type layer 112 (wavelength: 470–480 nm), and the area of the portion patterned by slanted lines extending upward to the right corresponds approximately to the intensity of the light emitted from the second p-type layer 113 (wavelength: 455 nm). When the two types of light emission having wavelengths of 470–480 nm and 455 nm, are combined, as is shown in FIG. 12, the peak wavelength of 460 to 470 nm is obtained. As stated earlier, this peak wavelength is an optimum wavelength for achieving a light emitting diode with good visibility and excellent blue monochromaticity.

The light emitting diode of the present invention having the above-described structures are superior in reproducibility and controllability, compared with a light emitting diode in which a p-type layer doped with aluminum acceptors is further doped with nitrogen donors. In the latter case, the two types of light emission by aluminum acceptors and by pairs of aluminum acceptors and nitrogen donors are simultaneously obtained from one p-type layer by adjusting the doping amounts of the aluminum acceptors and the nitrogen donors. It is not easy to control two types of light emitted from the same region, and therefore the peak wavelength and intensity of emitted light are not stable.

EXAMPLE 1

In this example, a p-n junction type blue light emitting diode was fabricated by use of 6H-type silicon carbide (band gap: approximately 3 eV).

FIG. 1 is a sectional view of a p-n junction type blue light emitting diode 100 in accordance with this example. The p-n junction of the light emitting diode 100 which contributes to light emission comprises an n-type layer 20 of an n-SiC single crystal, and a p-SiC single-crystal double-layer structure composed of a first p-type layer 30 and a second p-type layer 40. These layers are successively formed on a 6H-type n-SiC single-crystal substrate 10 in this order. An n-sided ohmic electrode 70 is formed of Ni on the back surface of the substrate 10, and a p-sided ohmic electrode 60 is formed of a laminate of Ti and Al on the top surface of the second p-type layer 40.

Figure 5:
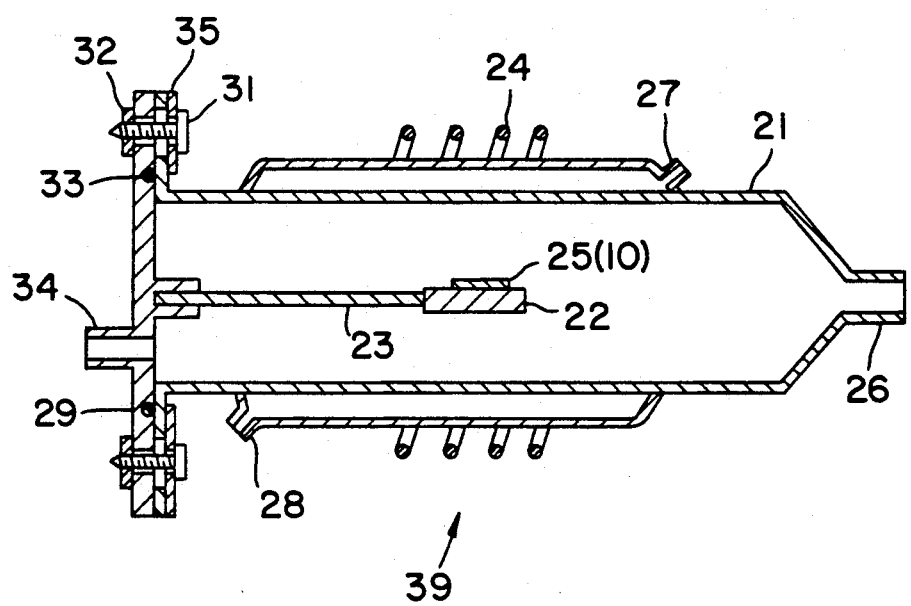
FIG. 5 is a schematic sectional view showing the structure of an apparatus for vapor phase epitaxy used for the fabrication of light emitting diodes according to the present invention.

FIG. 5 schematically shows an apparatus 39 for vapor phase epitaxy used for fabricating the light emitting diode of the present invention.

The apparatus 39 comprises a reactor tube 21 made of quartz in which a sample plate 22 is supported by a support rod 23. The sample plate 22 and the support rod 23 are both made of graphite. The sample plate 22 may be kept horizontal or appropriately inclined. A working coil 24 is wound around the reactor tube 21, to which a high-frequency current is applied to heat a sample 25 placed on the sample plate 22 to a given temperature. A branch tube 26 is connected to one end of the reactor tube 21, through which a source gas, a carrier gas, and an impurity gas are fed into the reactor tube 21. The reactor tube 21 has a double-tube structure. The outer tube of the reactor tube 21 has branch tubes 27 and 28, through which cooling water is supplied into the outer tube so as to cool the reactor tube 21. The other open end of the reactor tube 21 is closed with a flange 29 made of stainless steel, and sealed with a holding plate 35, bolts 31, nuts 32, and an 0-ring 33 all provided on the circumferential portion of the flange 29. The flange 29 is also provided with a branch tube 34 in the vicinity of the center thereof, through which the aforementioned gases supplied from the branch tube 26 are discharged.

Using the apparatus 39, the p-n junction type light emitting diode 100 was fabricated as follows:

First, as is shown in FIG. 5, the 6H-type n-SiC single-crystal substrate 10 (size: approximately 1 cm×1 cm) was placed on the sample plate 22 as the sample 25. As a growth plane of the substrate 10, a plane having an orientation inclined from the [0001] direction toward the <1120> direction at an angle of approximately 5 degree was used.

Next, while hydrogen gas as a carrier gas was being fed into the reactor tube 21 through the branch tube 26 at a flow rate of $1\times10^4$ cc/min, a high -frequency current was applied to the working coil 24 to heat the n-SiC single-crystal substrate 10 to a temperature of 1400°–1500° C. Then, a source gas and an impurity gas were added to the carrier gas, so that the n-type layer 20, the first p-type layer 30, and the second p-type layer 40 were successively grown on the substrate 10 in this order, thereby to form a p-n junction.

In this example, monosilane ($SiH_4$) gas and propane ($C_3H_8$) gas were used as the source gas. The flow rates of these two source gases were both set to approximately 1 cc/min. Trimethyl aluminum ($Ai(CH_3)_3$) gas and nitrogen ($N_2$) gas were used as the p-type impurity gas and the n-type impurity gas, respectively.

For the growth of the n-type layer 20 of an n-SiC single crystal, nitrogen gas was fed into the reactor tube 21 at a flow rate of 1–5 cc/min. By this feeding of nitrogen gas, the n-type layer 20 was doped with nitrogen impurities at a concentration of $5\times10^{17}$ to $5\times10^{18}$ $cm^{-3}$. The thickness of the n-type layer 20 was set to 1 to 5 μm.

For the growth of the first and second p-type layers 30 and 40 of a p-SiC single crystal, trimethyl aluminum gas was fed into the reactor tube 21 at a flow rate of 0.01 to 0.5 cc/min. At this time, as stated earlier, in order to improve the injection efficiency of electrons from the n-type layer 20 at the application of a forward bias voltage, the hole concentrations of the first and second p-type layers 30 and 40 were set to $5 \times 10^{15}$ to $5 \times 10^{17}$ cm$^{-3}$. The first p-type layer 30 was doped with aluminum acceptors, and the second p-type layer 40 was doped with nitrogen donors in addition to aluminum acceptors. The nitrogen gas was fed at a flow rate of 0.1 to 5 cc/min to obtain an nitrogen concentration of $1 \times 10^{17}$ to $1 \times 10^{19}$ cm$^{-3}$. As stated earlier, the thickness of the first p-type layer 30 was made smaller than the diffusion length of electrons in the first p-type layer 30, so that the electrons having flowed from the n-type layer 20 at the application of a forward bias voltage could diffuse into the second p-type layer 40 through the first p-type layer 30 so as to recombine with holes in both p-type layers 30 and 40 to effect different types of light emission. In this example, the thickness of the first p-type layer 30 was varied in the range of 0.01 to 0.5 μm. The thickness of the second p-type layer 40 was set to 1 to 5 μm.

Thereafter, the sample 25 was removed from the reactor tube 21. The n-type layer 20, the first p-type layer 30, and the second p-type layer 40 were selectively etched by dry etching to form a mesa configuration as is shown in FIG. 1. By this etching, the size at the p-n junction was approximately 250 μm × 250 μm. Carbon tetrafluoride ($CF_4$) gas and oxygen ($O_2$) gas were used as the etching gas.

Finally, the n-sided ohmic electrode 70 was formed of Ni on the back surface of the substrate 10, and the p-sided ohmic electrode 60 was formed of a laminate of Ti and Al on the top surface of the second p-type layer 40, resulting in the p-n junction type light emitting diode 100 as is shown in FIG. 1.

Figure 6:
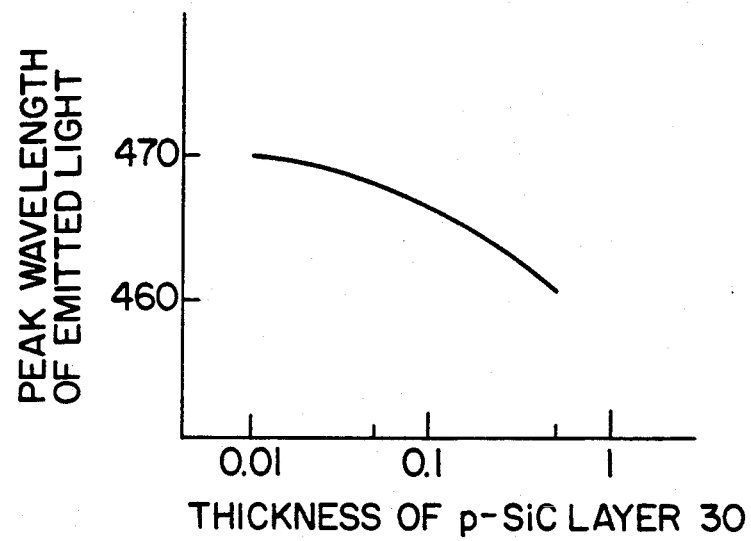
FIG. 6 shows the relationship between the peak wavelength and the thickness of the p-SiC single-crystal layer 30 of the light emitting diode of FIG. 1 according to the present invention.
Figure 7:
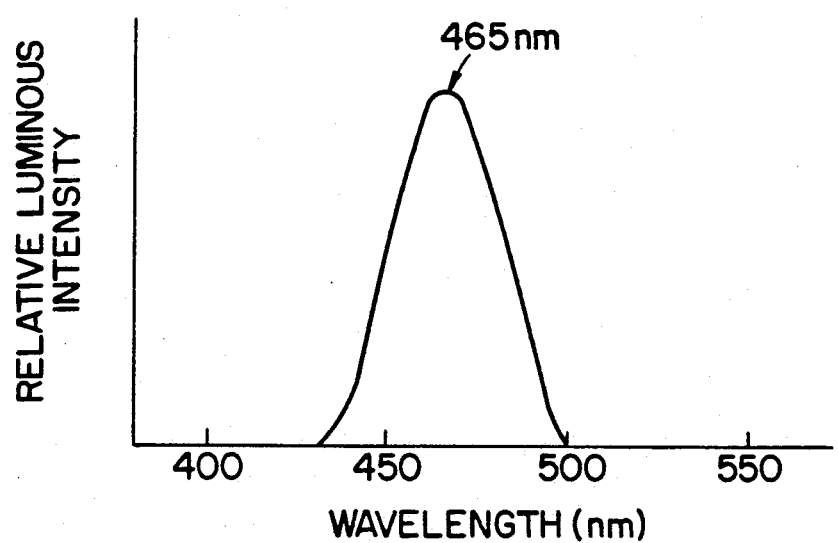
FIG. 7 is a diagram showing a typical emission spectrum of the light emitting diode of FIGS. 1 and 6 according to the present invention.

When the thus-fabricated light emitting diode 100 was operated by the application of a voltage of approximately 3.2 V, a current of 20 mA flowed therethrough, and blue light was emitted. Also, when the thickness of the first p-type layer 30 was varied in the range of 0.01 to 0.5 μm, the peak wavelength of the emitted light was successfully controlled within the range of 460 to 470 nm as is represented in FIG. 6. A typical emission spectrum of the above light is shown in FIG. 7.

EXAMPLE 2

Figure 2:
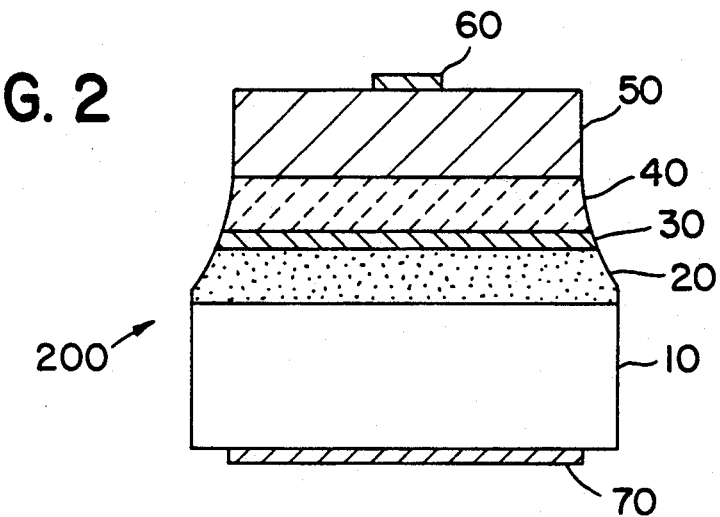
FIG. 2 is a sectional view of another light emitting diode according to the present invention.

Referring to FIG. 2, a light emitting diode 200 in accordance with this example was fabricated in the same manner as in Example 1, except that a third p-type layer 50 was formed between the second p-type layer 40 and the p-sided ohmic electrode 60. The hole concentration of the third p-type layer 50 was set to $5 \times 10^{17}$ to $1 \times 10^{19}$ cm$^{-3}$ so that it was higher than the hole concentrations of the first p-type layer 30 and the second p-type layer 40. In this way, according to this example, the current from the p-sided ohmic electrode 60 can flow over in the lateral directions inside the low-resistance third p-type layer 50, whereby light emission can be effected in a wider area of the p-n junction. The thickness of the third p-type layer 50 was set to 2 to 10 μm.

When the thus-fabricated light emitting diode 200 was operated by the application of a voltage of approximately 3.2 V, a current of 20 mA flowed therethrough, and blue light was emitted as in Example 1. The light emitting diode of this example could emit light at a wider area of the p-n junction, as stated earlier, allowing it to be used with high output efficiency. Thus, the brightness of the light emitting diode of this example was twice as high as that of Example 1.

EXAMPLE 3

Figure 3:
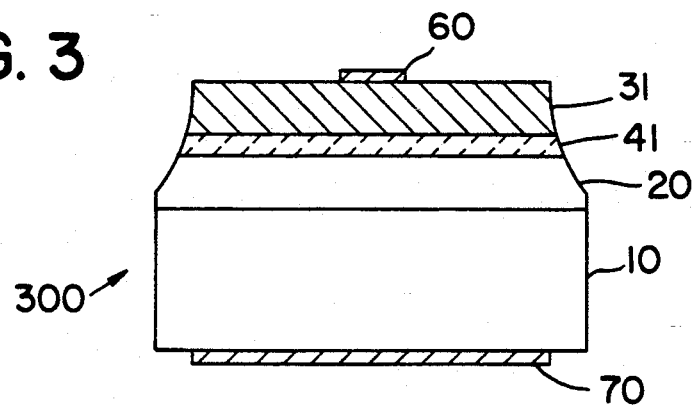
FIG. 3 is a sectional view of yet another light emitting diode according to the present invention.

Referring to FIG. 3, a light emitting diode 300 in accordance with this example was fabricated in the same manner as in Example 1, except that a first p-type layer 41 and a second p-type layer 31 were formed on the n-type layer 20 in this order, instead of the first p-type layer 30 and the second p-type layer 40. More particularly, the first p-type layer 41 was grown with the doping of both aluminum acceptors and nitrogen donors, and then the second p-type layer 31 was grown with the doping of only aluminum acceptors. The hole concentrations of the first and second p-type layers 41 and 31 were set to $5 \times 10^{15}$ to $5 \times 10^{17}$ cm$^{-3}$, and the nitrogen concentration of the first p-type layer 41 was set to $1 \times 10^{17}$ to $1 \times 10^{19}$. The thickness of the first p-type layer 41 was varied in the range of 0.01 to 0.5 μm, and the thickness of the second p-type layer 31 was set to 1 to 5 μm.

Figure 8:
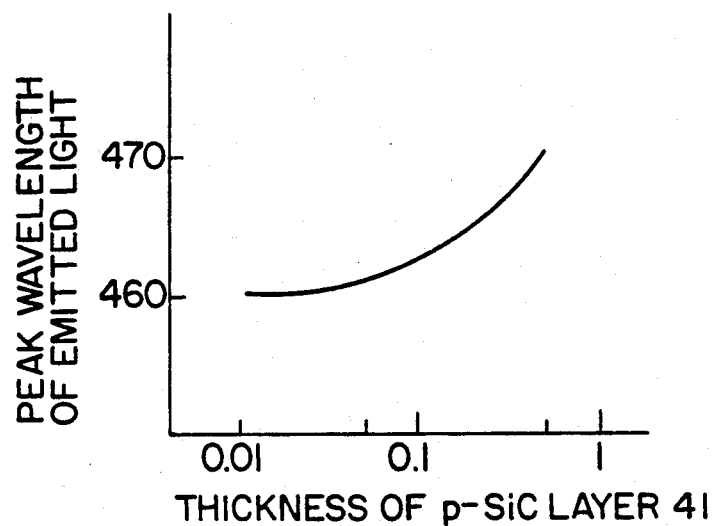
FIG. 8 shows the relationship between the peak wavelength and the thickness of the p-SiC single-crystal layer 41 of the light emitting diode of FIG. 3 according to the present invention.

When the thus-fabricated light emitting diode 300 was operated by the application of a voltage of approximately 3.2 V, a current of 20 mA flowed therethrough, and blue light was emitted as in Example 1. Also, when the thickness of the first p-type layer 41 was varied as stated above, the peak wavelength of emitted light was successfully controlled within the range of 460 to 470 nm as is represented in FIG. 8. A typical emission spectrum of the above light was similar to the one shown in FIG. 7.

EXAMPLE 4

Figure 4:
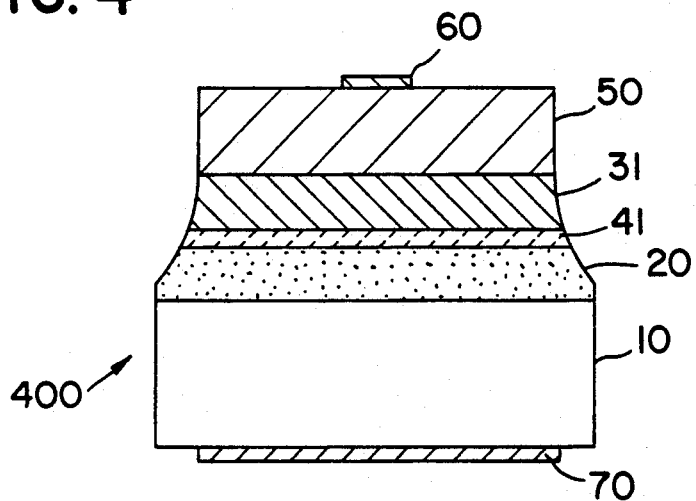
FIG. 4 is a sectional view of still yet another light emitting diode according the present invention.

Referring to FIG. 4, a light emitting diode 400 according to this example was fabricated in the same manner as in Example 3, except that a third p-type layer 50 was formed between the second p-type layer 31 and the p-sided ohmic electrode 60. The hole concentration of the third p-type layer 50 was set to $5 \times 10^{17}$ to $1 \times 10^{19}$ cm$^{-3}$ so that it was higher than the hole concentrations of the first p-type layer 41 and the second p-type layer 31. In this way, according to this example, the current from the p-sided ohmic electrode 60 can flow over in the lateral directions inside the low-resistance third p-type layer 50, whereby light emission can be effected in a wider area of the p-n junction. The thickness of the third p-type layer 50 was set to 2 to 10 μm.

When the thus-fabricated light emitting diode 400 was operated by the application of a voltage of approximately 3.2 V, a current of 20 mA flowed therethrough, and blue light was emitted as in Example 1. The light emitting diode of this example could emit light at a wider area of the p-n junction, as stated earlier, allowing it to be used with high output efficiency. Thus, the brightness of the light emitting diode of this example was twice as high as that of Example 1.

Thus, the silicon carbide p-n junction type light emitting diode of the present invention has a good visibility and excellent blue monochromaticity. Such a light emitting diode can be fabricated with good controllability and reproducibility. Therefore, the light emitting diode of the present invention allows multi-color display for various display apparatus, as well as high-speed and high-density reading of recorded information for various information processing units with light emitting diodes used as a light source, as will be appreciated. Moreover, since the light emitting diode of the present invention can be fabricated on a large scale, it can be used in significantly expanded fields of applications.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light emitting diode of silicon carbide having a p-n junction, comprising:
   an n-type layer of silicon carbide doped with donor impurities;
   a first p-type layer of silicon carbide formed on the n-type layer, said first p-type layer being doped with acceptor impurities; and
   a second p-type layer of silicon carbide formed on the first p-type layer, said second p-type layer being doped with acceptor impurities and donor impurities;
   wherein said first p-type layer has a thickness less than the diffusion length of electrons having flowed from said n-type layer under a forward bias condition, so that said first p-type layer effects light emission related to the acceptor impurities caused by recombination with the electrons having flowed from said n-type layer, and said second p-type layer effects light emission by donor-acceptor pairs caused by recombination with the electrons having flowed from said n-type layer.

2. A light emitting diode according to claim 1, wherein a third p-type layer is formed on said second p-type layer, said third p-type layer having a higher hole concentration than said first p-type layer and said second p-type layer.

3. A light emitting diode according to claim 1, wherein the thickness of said first p-type layer is within the range of 0.01 to 0.5 $\mu$m.

4. A light emitting diode according to claim 1, wherein a peak wavelength of light obtained based on the light emissions effected by said first p-type layer and said second p-type layer is within the range of 460 to 470 nm.

5. A light emitting diode according to claim 1, wherein said acceptor impurities are aluminum and said donor impurities are nitrogen.

6. A light emitting diode according to claim 1, wherein said silicon carbide is of a polytype selected from the group consisting of 6H, 15R, and 4H.

7. A light emitting diode of silicon carbide having a p-n junction, comprising:
   an n-type layer of silicon carbide doped with donor impurities;
   a first p-type layer of silicon carbide formed on the n-type layer, said first p-type layer being doped with acceptor impurities and donor impurities; and
   a second p-type layer of silicon carbide formed on the first p-type layer, said second p-type layer being doped with acceptor impurities;
   wherein said first p-type layer has a thickness less than the diffusion length of electrons having flowed from said n-type layer under a forward bias condition, so that said first p-type layer effects light emission by donor-acceptor pairs caused by recombination with the electrons having flowed from said n-type layer, and said second p-type layer effects light emission related to the acceptor impurities caused by recombination with the electrons having flowed from said n-type layer.

8. A light emitting diode according to claim 7, wherein a third p-type layer is formed on said second p-type layer, said third p-type layer having a higher hole concentration than said first p-type layer and said second p-type layer.

9. A light emitting diode according to claim 7, wherein the thickness of said first p-type layer is within the range of 0.01 to 0.5 $\mu$m.

10. A light emitting diode according to claim 7, wherein a peak wavelength of light obtained based on the light emissions effected by said first p-type layer and said second p-type layer is within the range of 460 to 470 nm.

11. A light emitting diode according to claim 7, wherein said acceptor impurities are aluminum and said donor impurities are nitrogen.

12. A light emitting diode according to claim 7, wherein said silicon carbide is of a polytype selected from the group consisting of 6H, 15R, and 4H.

13. A light emitting diode, comprising:
   an n-type layer of silicon carbide doped with donor impurities;
   a first p-type layer of silicon carbide formed on the n-type layer; and
   a second p-type layer of silicon carbide formed on the first p-type layer, wherein one of said first and second p-type layers is doped with acceptor impurities, and the other of said first and second p-type layers is doped with acceptor impurities and donor impurities;
   wherein an application of a forward bias voltage across a p-n junction formed by said n-type layer and said first and second p-type layers produces emission of light which is substantially blue monochromatic; and
   wherein the first p-type layer has a thickness which is less than the diffusion length of electrons flowing from the n-type under s forward bias condition.

14. A light emitting diode according to, comprising:
   an n-type semiconductor layer doped with donor impurities;
   a first p-type semiconductor layer formed on the n-type semiconductor layer; and
   a second p-type semiconductor layer formed on the first p-type semiconductor layer, wherein one of said first and second p-type semiconductor layers is doped with acceptor impurities, and the other of said first and second p-type semiconductor layers is doped with acceptor impurities and donor impurities;
   wherein an application of a forward bias voltage across a p-n junction formed by said n-type semiconductor layer and said first and second p-type semiconductor layers produces emission of light which is substantially blue monochromatic; and
   wherein the first p-type semiconductor layer has a thickness which is less than the diffusion length of electrons flowing from the n-type semiconductor layer under a forward bias condition.

* * * * *

UNITED STATES PATENT AND TRADEMARK OFFICE
CERTIFICATE OF CORRECTION

PATENT NO. : 5,329,141
DATED : July 12, 1994
INVENTOR(S) : A. Suzuki, et al.

It is certified that error appears in the above-indentified patent and that said Letters Patent is hereby corrected as shown below:

Column 1, line 27: ""GAN" should read --GaN--;

column 2, line 16: "1700° C. to 1800° C.," should read --1700° C to 1800° C,--;

column 5, line 22: "$\mu_3$" should read --$\mu_e$--;

column 8, line 5: "A1" should read --Al-- (chemical symbol for aluminum);

column 8, line 39: "<1120>" should read --<11$\bar{2}$0>--;

column 8, line 8: "(Ai(CH$_3$)$_3$)" should read --(Al(CH$_3$)$_3$)--;

column 9, line 32: "A1" should read --Al-- (chemical symbol for aluminum).

Signed and Sealed this

Seventh Day of February, 1995

Attest:

BRUCE LEHMAN

*Attesting Officer*  *Commissioner of Patents and Trademarks*